US012647091B2

(12) United States Patent
    Motoyama

(10) Patent No.: US 12,647,091 B2
(45) Date of Patent: Jun. 2, 2026

(54) FILTER DEVICE

(71) Applicant: Murata Manufacturing Co., Ltd.,
    Nagaokakyo (JP)

(72) Inventor: Hiroto Motoyama, Nagaokakyo (JP)

(73) Assignee: MURATA MANUFACTURING CO.,
    LTD., Kyoto (JP)

( * ) Notice: Subject to any disclaimer, the term of this
    patent is extended or adjusted under 35
    U.S.C. 154(b) by 118 days.

(21) Appl. No.: 18/755,971

(22) Filed: Jun. 27, 2024

(65) Prior Publication Data

US 2024/0348224 A1      Oct. 17, 2024

Related U.S. Application Data

(63) Continuation of application No.
    PCT/JP2022/042081, filed on Nov. 11, 2022.

(30) Foreign Application Priority Data

Jan. 19, 2022    (JP) ................................. 2022-006334

(51) Int. Cl.
    *H03H 7/01*        (2006.01)
    *H03H 1/00*        (2006.01)
(52) U.S. Cl.
    CPC ........ *H03H 7/0161* (2013.01); *H03H 7/0115*
         (2013.01); *H03H 2001/0085* (2013.01)
(58) Field of Classification Search
    CPC ............... H03H 7/0161; H03H 7/0115; H03H
         2001/0085; H01P 1/203; H01P 7/08
                    (Continued)

(56) References Cited

U.S. PATENT DOCUMENTS 7,116,186 B2 * 10/2006 Chen .................... H04B 1/0067
                                                  333/204
    2013/0154769 A1 * 6/2013 Masuda .................... H01P 7/08
                                                  333/185
                    (Continued)

FOREIGN PATENT DOCUMENTS

JP        58-103202 A      6/1983
    JP        06-006104 A      1/1994
                    (Continued)

OTHER PUBLICATIONS

Official Communication issued in International Patent Application
No. PCT/JP2022/042081, mailed on Jan. 10, 2023, 9 pages.

*Primary Examiner* — Jorge L Salazar, Jr.
(74) *Attorney, Agent, or Firm* — Keating & Bennett, LLP

(57)        ABSTRACT
A filter device includes a dielectric, first and second elec-
trodes in the dielectric and connected to a ground terminal,
and first to third resonators. The first and second resonators
are between the first and second electrodes. The first reso-
nator is connected to an input terminal, and the second
resonator is connected to an output terminal. The third
resonator is between the first and second resonators. The first
resonator includes a first plate conductor connected to the
input terminal and the ground terminal. The second resona-
tor includes a second plate conductor connected to the
output terminal and the ground terminal. The first and
second plate conductors extend in the dielectric in an X-axis
direction. The first to third resonators are arranged in a
Y-axis direction. The third resonator includes a capacitor
electrode opposite to the second electrode, and an inductor
via connected to the capacitor electrode and the first elec-
trode.

20 Claims, 9 Drawing Sheets

(58) Field of Classification Search
USPC .................................................. 333/175, 185
See application file for complete search history.

(56) References Cited

U.S. PATENT DOCUMENTS

2017/0033761 A1*  2/2017  Huang .................. H03H 11/16
2018/0226934 A1   8/2018  Ashida et al.
2023/0044859 A1   2/2023  Motoyama

FOREIGN PATENT DOCUMENTS

JP        07-336104  A     12/1995
JP        2018-125804  A    8/2018
WO        2021/241208  A1   12/2021

* cited by examiner

FILTER DEVICE

CROSS REFERENCE TO RELATED APPLICATIONS

This application claims the benefit of priority to Japanese Patent Application No. 2022-006334 filed on Jan. 19, 2022 and is a Continuation Application of PCT Application No. PCT/JP2022/042081 filed on Nov. 11, 2022. The entire contents of each application are hereby incorporated herein by reference.

BACKGROUND OF THE INVENTION

1. Field of the Invention

The present disclosure relates to filter devices, and more particularly, to techniques to improve characteristics of the filter devices.

2. Description of the Related Art

Japanese Patent Laid-Open No. 2018-125804 discloses a bandpass filter having a plurality of resonators disposed between shield electrodes in a main body of a dielectric. Each of the plurality of resonators includes a plate conductor having one end connected to a shield electrode through a via and the other end open, and adjacent resonators function as a bandpass filter by electromagnetic field coupling.

SUMMARY OF THE INVENTION

The bandpass filter disclosed in Japanese Patent Laid-Open No. 2018-125804 has resonators including plate conductors disposed in the same plane in the dielectric. Thus, although adjacent resonators generate magnetic fields in different directions, the generated magnetic fields may affect one another, resulting in the filter having a reduced attenuation characteristic.

Example embodiments of the present invention improve characteristics of filter devices each including a plurality of resonators.

A filter device according to an example embodiment of the present disclosure includes a dielectric, an input terminal, an output terminal, a ground terminal, a plate-shaped first electrode and a plate-shaped second electrode, and first, second and third resonators. The first electrode and the second electrode are in the dielectric opposite to each other, and connected to the ground terminal. The first resonator and the second resonator are between the first electrode and the second electrode. The first resonator is connected to the input terminal, and the second resonator is connected to the output terminal. The third resonator is between the first resonator and the second resonator in the dielectric. The first resonator includes a first plate conductor including a first end connected to the input terminal and a second end connected to the ground terminal. The second resonator includes a second plate conductor including a first end connected to the output terminal and a second end connected to the ground terminal. The first and second plate conductors each extend in a first direction in the dielectric. The first, second and third resonators are arranged in a second direction intersecting the first direction. The third resonator includes a capacitor electrode opposite to the second electrode, and an inductor via connected to the capacitor electrode and the first electrode. The inductor via extends in a third direction from the first electrode toward the second electrode.

A filter device according to an example embodiment of the present disclosure includes first to third resonators between shield electrodes (a first electrode and a second electrode). The first resonator and the second resonator connected to the input terminal and the output terminal, respectively, are resonators each including a plate conductor extending in the first direction (an X-axis direction), and the third resonator between the two resonators is a resonator including an inductor via extending in the third direction (a Z-axis direction). Therefore, a magnetic field generated at the first resonator and a magnetic field generated at the third resonator have directions, respectively, in a skewed position and so do a magnetic field generated at the second resonator and the magnetic field generated at the third resonator, and an effect of a magnetic field between the resonators is thus reduced or prevented. The filter device can thus have an improved characteristic.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, example embodiments of the present disclosure will be described in detail with reference to the drawings. Note that in the figures, identical or corresponding components are identically denoted and will not be described redundantly.

First Example Embodiment

Basic configuration of communication apparatus

Figure 1:
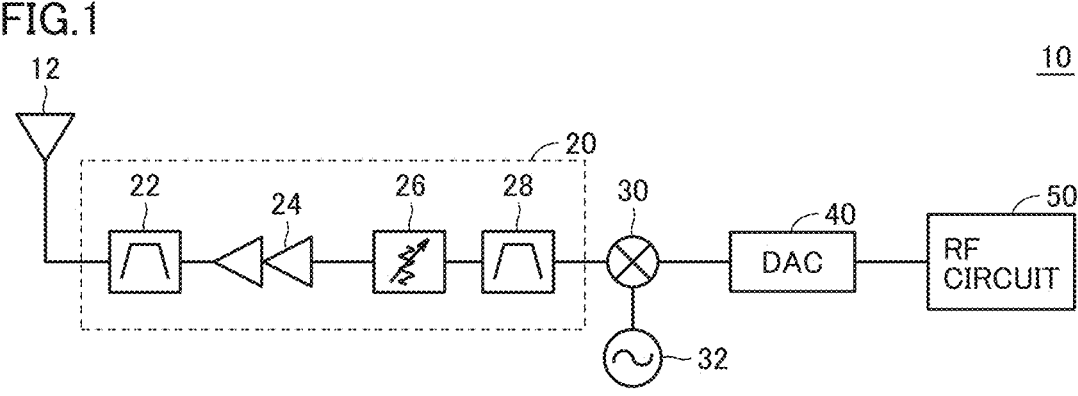
FIG. 1 is a block diagram of a radio-frequency front-end circuit in which a filter device according to a first example embodiment of the present invention is mounted.

FIG. 1 is a block diagram of a communication apparatus 10 including a radio-frequency front-end circuit 20 to which a filter device according to a first example embodiment is applied. Communication apparatus 10 is, for example, a mobile phone base station.

Referring to FIG. 1, communication apparatus 10 includes an antenna 12, a radio-frequency front-end circuit 20, a mixer 30, a local oscillator 32, a D/A converter (DAC) 40, and an RF circuit 50. Radio-frequency front-end circuit 20 includes bandpass filters 22 and 28, an amplifier 24, and an attenuator 26. While FIG. 1 illustrates a case in which radio-frequency front-end circuit 20 includes a transmission circuit that transmits a radio-frequency signal from antenna 12, radio-frequency front-end circuit 20 may include a reception circuit that receives a radio-frequency signal via antenna 12.

Communication apparatus 10 up-converts a transmission signal that is transmitted from RF circuit 50 into a radio-frequency signal, and radiates the radio-frequency signal from antenna 12. A modulated digital signal that is a transmission signal output from RF circuit 50 is converted into an analog signal by D/A converter 40. Mixer 30 mixes the transmission signal converted from the digital signal to the analog signal by D/A converter 40 with an oscillation signal received from local oscillator 32, and upconverts the mixture of the signals to a radio-frequency signal. Bandpass filter 28 removes any unwanted wave generated by the up-conversion, and extracts only a transmission signal in a desired frequency band. Attenuator 26 adjusts the transmission signal in intensity. Amplifier 24 amplifies the transmission signal having passed through attenuator 26 in power to a predetermined level. Bandpass filter 22 removes any unwanted wave generated in the amplification step, and only passes a signal component in a frequency band defined in accordance with a communication standard. The transmission signal having passed through bandpass filter 22 is radiated from antenna 12.

A filter device corresponding to an example embodiment of the present disclosure can be used as bandpass filters 22 and 28 in communication apparatus 10 described above.

Configuration of Filter Device

Figure 2:
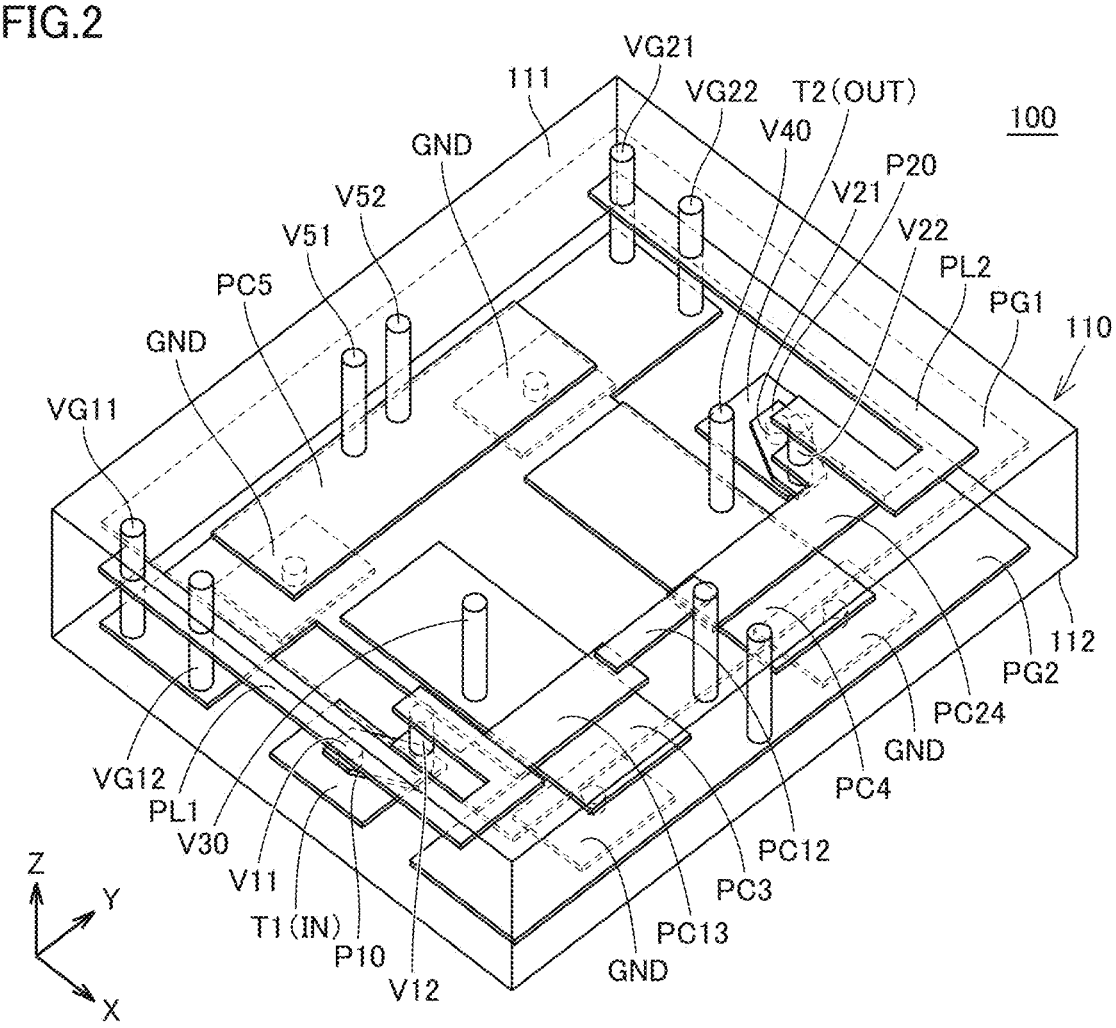
FIG. 2 is a perspective view showing an interior of the filter device according to the first example embodiment of the present invention.
Figure 3:
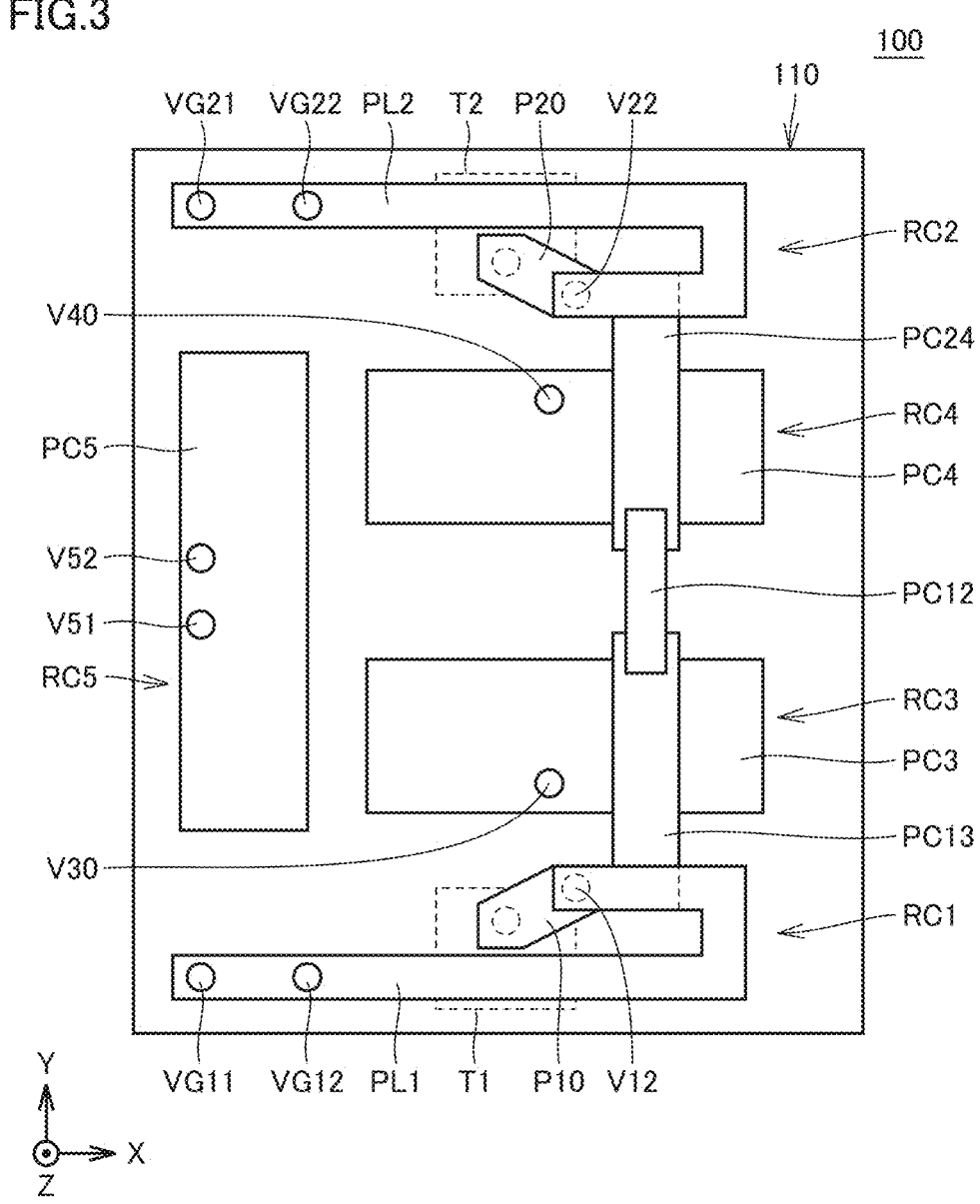
FIG. 3 is a plan view showing an interior of the filter device according to the first example embodiment of the present invention.

Hereinafter, a detailed configuration of a filter device 100 according to the first example embodiment will be described with reference to FIGS. 2 and 3. FIGS. 2 and 3 are a perspective view and a plan view, respectively, showing an interior of filter device 100.

Referring to FIGS. 2 and 3, filter device 100 includes a dielectric 110 in a shape of a cuboid or substantially a cuboid in which a plurality of dielectric layers are stacked in a stacking direction. Each dielectric layer of dielectric 110 is made of, for example, a ceramic. In dielectric 110, inductors and capacitors are configured by a plurality of interconnection patterns and electrodes provided in or on each dielectric layer and a plurality of vias provided between the dielectric layers. The inductors and capacitors define an LC resonant circuit.

In the following description, the stacking direction for dielectric 110 is defined as a "Z-axis direction," a direction perpendicular to the Z-axis direction and along a shorter side of dielectric 110 is defined as an "X-axis direction," and a direction along a longer side of dielectric 110 is defined as a "Y-axis direction". Hereinafter, in each figure, a positive direction along the Z axis may be referred to as an upper side, and a negative direction along the Z axis may be referred to as a lower side. Note FIG. 2 and FIG. 3, and FIG. 4, FIG. 6, FIG. 8, FIG. 10, FIG. 12, and FIG. 13 described later, do not show dielectric 110, and only show conductors of internally formed interconnection patterns, vias, and terminals.

Dielectric 110 has an upper surface 111 and a lower surface 112. An input terminal T1, an output terminal T2, and a ground terminal GND are provided on lower surface 112 of dielectric 110. Input terminal T1, output terminal T2, and ground terminal GND are external terminals to connect filter device 100 to an external device, and are plate-shaped electrodes. Specifically, input terminal T1, output terminal T2, and ground terminal GND are LGA (Land Grid Array) terminals regularly disposed on lower surface 112 of dielectric 110.

A plate electrode PG2 is provided at a dielectric layer close to lower surface 112 of dielectric 110. Plate electrode PG2 is connected to ground terminal GND via a via. Furthermore, a plate electrode PG1 is provided at a dielectric layer close to upper surface 111 of dielectric 110. In FIG. 2, plate electrode PG1 is indicated by a broken line.

Plate electrode PG1 and plate electrode PG2 are connected by ground vias VG11, VG12, VG21, and VG22 extending in the stacking direction for dielectric 110. Another ground via that connects plate electrode PG1 and plate electrode PG2 may further be provided.

Plate electrode PG2 is substantially in an H shape when dielectric 110 is viewed in a plan view in the Z-axis direction, and input terminal T1 and output terminal T2 are each disposed in an opening of plate electrode PG2.

Filter device 100 according to the first example embodiment includes five resonators RC1 to RC5 inside dielectric 110, for example. Resonator RC1 is connected to input terminal T1, and resonator RC2 is connected to output terminal T2. Resonators RC3 to RC5 are disposed in dielectric 110 between resonator RC1 and resonator RC2. Resonators RC1 to RC5 are coupled to one another by an electromagnetic field. Adjusting each resonator's resonance frequency allows filter device 100 to function as a bandpass filter that selectively passes a signal in a specific frequency band. A radio-frequency signal received at input terminal T1 propagates through resonators RC1, RC3, RC5, RC4 and RC2 sequentially in this order, and is output at output terminal T2.

Resonator RC1 includes a strip-shaped plate conductor PL1 disposed between plate electrode PG1 and plate electrode PG2. Plate conductor PL1 is substantially in a J shape having a bent portion, and includes two conductors extending in the X-axis direction and a conductor extending in the Y-axis direction and connecting the two conductors. Plate conductor PL1 has one end connected to input terminal T1 through vias V11 and V12 and a plate electrode P10. Plate conductor PL1 has the other end connected to plate electrodes PG1 and PG2 by ground vias VG11 and VG12. When dielectric 110 is viewed in the plan view in the Z-axis direction, plate conductor PL1 partially overlaps with plate electrode PG1 and plate electrode PG2. Resonator RC1 functions as a so-called "distributed constant resonator" by a capacitance component between plate conductor PL1 and plate electrodes PG1 and PG2 and an inductance component of plate conductor PL1.

Resonator RC2 includes a strip-shaped plate conductor PL2 disposed between plate electrode PG1 and plate electrode PG2. Plate conductor PL2 is substantially in a J shape having a bent portion, and includes two conductors extending in the X-axis direction and a conductor extending in the Y-axis direction and connecting the two conductors. Plate conductor PL2 has one end connected to output terminal T2 through vias V21 and V22 and plate electrode P20. Plate conductor PL2 has the other end connected to plate electrodes PG1 and PG2 by ground vias VG21 and VG22. When dielectric 110 is viewed in the plan view in the Z-axis direction, plate conductor PL2 partially overlaps with plate electrode PG1 and plate electrode PG2, and resonator RC2 functions as a distributed constant resonator by a capacitance component between plate conductor PL2 and plate electrodes PG1 and PG2 and an inductance component of plate conductor PL2.

Resonator RC3 is disposed in dielectric 110 adjacent to resonator RC1 in a positive direction along the Y axis. Resonator RC3 includes a capacitor electrode PC3 and an inductor via V30. Capacitor electrode PC3 is a generally rectangular plate electrode extending in the X-axis direction. When dielectric 110 is viewed in the plan view in the Z-axis direction, capacitor electrode PC3 is disposed so as to at least partially overlap with plate electrode PG2. Capacitor electrode PC3 and plate electrode PG2 define a capacitor. Inductor via V30 is connected between capacitor electrode PC3 and plate electrode PG1. That is, resonator RC3 functions as a so-called "λ/4 resonator" having an inductor and a capacitor connected in series between plate electrode PG1 and plate electrode PG2.

Resonator RC4 is disposed in dielectric 110 adjacent to resonator RC2 in a negative direction along the Y axis. In other words, resonator RC4 is disposed between resonator RC2 and resonator RC3. Resonator RC4 includes a capacitor electrode PC4 and an inductor via V40. Capacitor electrode PC4 is a generally rectangular plate electrode extending in the X-axis direction. When dielectric 110 is viewed in the plan view in the Z-axis direction, capacitor electrode PC4 is disposed so as to at least partially overlap with plate electrode PG2. Capacitor electrode PC5 and plate electrode PG2 define a capacitor. Inductor via V40 is connected between capacitor electrode PC4 and plate electrode PG1. That is, resonator RC4 defines and functions as a λ/4 resonator including an inductor and a capacitor connected in series between plate electrode PG1 and plate electrode PG2.

As well as resonators RC3 and RC4, resonator RC5 is a λ/4 resonator having an inductor and a capacitor connected in series between plate electrode PG1 and plate electrode PG2. Resonator RC5 includes a capacitor electrode PC5 and inductor vias V51 and V52. Capacitor electrode PC5 is a generally rectangular plate electrode extending in the Y-axis direction. Capacitor electrode PC5 is disposed in dielectric 110 apart from resonators RC3 and RC4 in a region in a negative direction along the X axis with respect to resonators RC3 and RC4. Capacitor electrode PC5 and plate electrode PG2 define a capacitor. Inductor vias V51 and V52 are connected to capacitor electrode PC5 and plate electrode PG1.

Resonators RC3 to RC5 have capacitor electrodes PC3 to PC5, respectively, disposed in the same plane in dielectric 110 and capacitively coupled to one another. Plate conductors PL1 and PL2 of resonators RC1 and RC2 may or may not be disposed in the same plane as capacitor electrodes PC3 to PC5 of resonators RC3 to RC5, in dielectric 110.

Furthermore, filter device 100 further includes plate electrodes PC13, PC24, and PC12 to adjust coupling between the resonators. Plate electrodes PC13 and PC24 are strip-shaped electrodes substantially in an L shape, and plate electrode PC12 is a strip-shaped electrode extending in the Y-axis direction.

When dielectric 110 is viewed in the plan view in the Z-axis direction, plate electrode PC13 has one end connected to plate conductor PL1 of resonator RC1 through via V12, and is also disposed so as to partially overlap with capacitor electrode PC3 of resonator RC3. Plate electrode PC13 adjusts a degree of capacitive coupling between resonator RC1 and resonator RC3.

When dielectric 110 is viewed in the plan view in the Z-axis direction, plate electrode PC24 has one end connected to plate conductor PL2 of resonator RC2 through via V22, and is also disposed so as to partially overlap with capacitor electrode PC4 of resonator RC4. Plate electrode PC24 adjusts a degree of capacitive coupling between resonator RC2 and resonator RC4.

Plate electrode PC12 is disposed so as to partially overlap with plate electrode PC13 and plate electrode PC24 when dielectric 110 is viewed in the plan view in the Z-axis direction. Plate electrode PC12 adjusts a degree of capacitive coupling between resonator RC1 and resonator RC2.

In such a filter device 100, resonators RC1 and RC2, which are connected to an external device, tend to be low in impedance for miniaturization and low profile, and it may be difficult to ensure a wide passband width. Accordingly, it is desirable to make impedance as high as possible. In order to achieve this, for filter device 100, resonators RC1 and RC2 connected to the input/output terminals are not configured to use a capacitor electrode as resonators RC3 to RC5 are, and instead configured only by a parasitic capacitance of a strip-shaped plate conductor. The parasitic capacitance of the plate conductor obtains a capacitance smaller than that of such a capacitor electrode as resonators RC3 to RC5. Accordingly, by increasing a line length of the plate conductor in order to increase an inductance component, a desired resonance frequency of the resonators can be achieved while keeping the resonator's impedance high. Specifically, resonators RC1 and RC2 are adjusted in resonance frequency by adjusting the positions of the bent portions of plate conductors PL1 and PL2.

While resonators RC3 to RC5 obtain inductance components by inductor vias V30, V40, V51, and V52, a dimension of dielectric 110 in the Z-axis direction, in which the inductor vias extend, is shorter than those of the dielectric in the X- and Y-axes directions. Accordingly, achieving a desired resonance frequency requires an increased capacitance component. Accordingly, a relatively large area will be required for capacitor electrodes PC3 to PC5 in resonators RC3 to RC5.

As has been set forth above, resonators RC1 and RC2 obtain a capacitance component by parasitic capacitances of plate conductors PL1 and PL2, and a desired resonance frequency is achieved by increasing in length the lines of plate conductors PL1 and PL2 to obtain an increased inductance component. Therefore, an area in dielectric 110 required for resonators RC1 and RC2 is smaller than when a capacitor electrode is used, which can contribute to miniaturization in size of filter device 100 as a whole.

In filter device 100, resonators RC1 and RC2 have their main current paths in a direction in which the plate conductors extend, that is, a direction along the X axis. Resonators RC3 to RC5 have their main current paths in a direction in which the inductor vias extend, that is, a direction along the Z axis. That is, the current path in resonator RC1 and those in resonators RC3 to RC5 are in a skewed position and so are that of resonator RC2 and those of resonators RC3 to RC5. Therefore, magnetic fields generated will also have directions in a skewed position. This reduces magnetic coupling between resonator RC1 and resonators RC3 to RC5 and magnetic coupling between resonator RC2 and resonators RC3 to RC5. Thus, such a combination of resonators as allowing generated magnetic fields to be in a skewed position can prevent or reduce reduction in an attenuation characteristic accompanying unintended magnetic coupling between the resonators.

Figure 4:
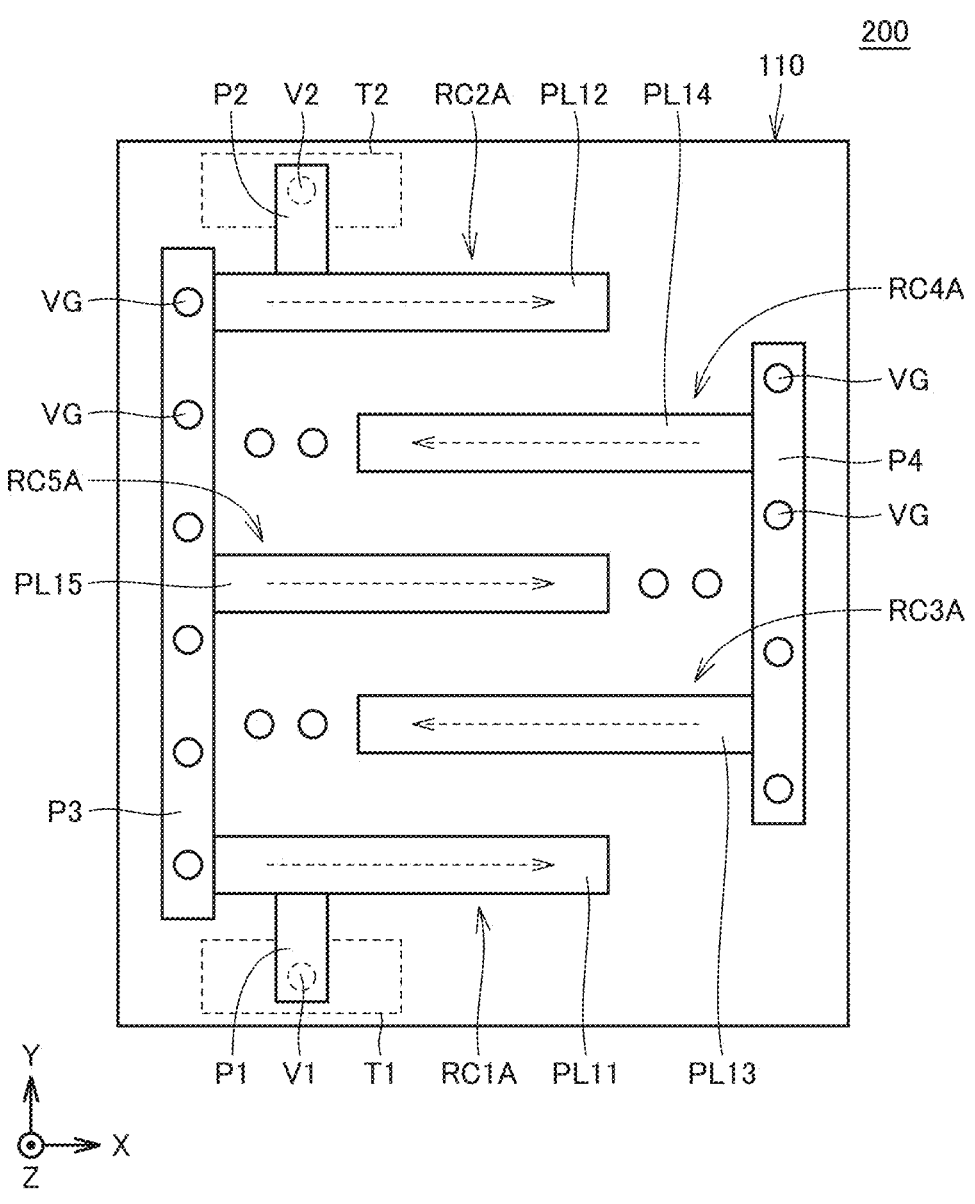
FIG. 4 is a plan view showing an interior of a filter device of a comparative example.

The above-described feature of filter device 100 according to the first example embodiment will be described in detail with reference to a comparative example. FIG. 4 is a plan view showing an interior of a filter device 200 of a comparative example.

Referring to FIG. 4, filter device 200 includes five resonators RC1A to RC5A inside dielectric 110 in the same manner as filter device 100 of the first example embodiment, and passes a signal of a specific frequency band in a radio-frequency signal received at an input terminal T1 and outputs the signal at an output terminal T2. The radio-frequency signal received at input terminal T1 propagates through resonators RC1A, RC3A, RC5A, RC4A, and RC2A sequentially in this order, and is output at output terminal T2.

Each of resonators RC1A to RC5A is a distributed constant resonator having one end connected to ground terminal GND and the other end open. Resonators RC1A, RC2A, and RC5A include strip-shaped plate conductors PL11, PL12, and PL15, respectively, each having one end connected to a plate electrode P3 disposed along a longer side of dielectric 110 in the negative direction along the X axis. Plate conductors PL11, PL12, and PL15 extend from plate electrode P3 in a positive direction along the X axis, and have their respective other ends open. Plate electrode P3 is connected by a plurality of ground vias VG to such plate electrodes PG1 and PG2 as included in filter device 100.

Resonators RC3A and RC4A include strip-shaped plate conductors PL13 and PL14, respectively, each having one end connected to a plate electrode P4 disposed along a longer side of dielectric 110 in the positive direction along the X axis. Plate conductors PL13 and PL14 extend from plate electrode P4 in the negative direction along the X axis, and have their respective other ends open. Plate electrode P4 is connected to plate electrodes PG1 and PG2 by a plurality of ground vias VG.

Plate conductors PL11 to PL15 of the resonators are disposed in the same plane in dielectric 110.

Figure 5:
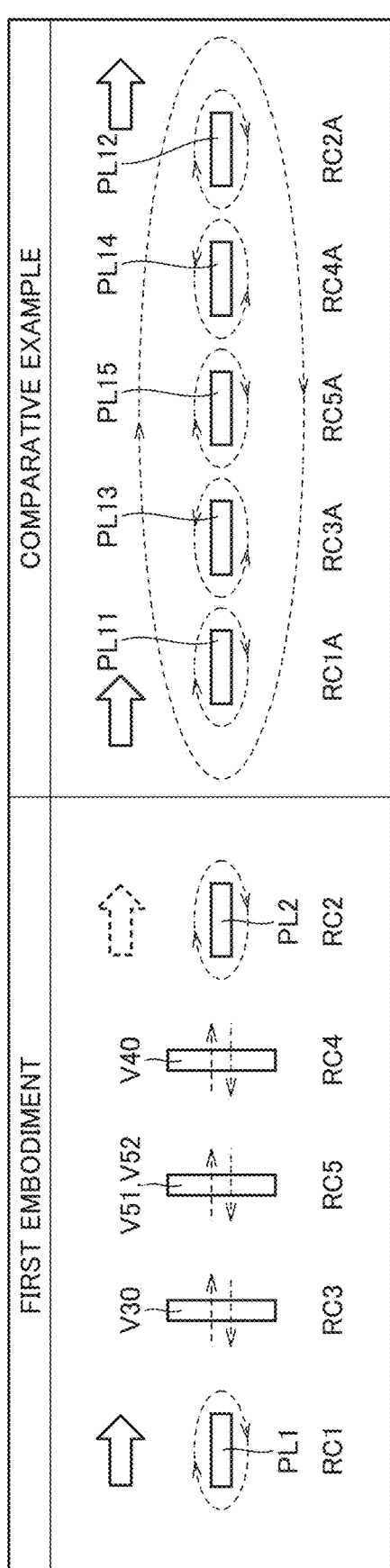
FIG. 5 is a diagram for illustrating a direction of a magnetic field generated at each resonator in each of the filter device of the first example embodiment of the present invention and the filter device of the comparative example.

FIG. 5 is a diagram for illustrating a direction of a magnetic field generated at each resonator in each of the filter device of the first example embodiment and the filter device of the comparative example. FIG. 5 shows a direction of a magnetic field generated at each resonator when viewed in FIGS. 3 and 4 in the positive direction along the X axis.

Filter device 200 of the comparative example has resonators configured by plate conductors disposed in the same plane. Plate conductors PL11, PL12, and PL15 and plate conductors PL13 and PL14 extend from a ground end in opposite directions, and thus generate magnetic fields in directions opposite to each other. However, as the plate conductors are disposed in the same plane, and furthermore, pass currents in the same, X-axis direction, magnetic coupling can not a little occur between the plate conductors. Due to the magnetic coupling between the conductors, a portion of a signal component in a non-passband would propagate from input terminal T1 to output terminal T2, and an attenuation characteristic in the non-passband may deteriorate.

In contrast, in the case of filter device 100 of the first example embodiment, plate conductors PL1 and PL2 of resonators RC1 and RC2 connected to input terminal Tl and output terminal T2, respectively, pass currents in the X-axis direction and inductor vias V30, V40, V51, and V52 of resonators RC3 to RC5 pass currents in the Z-axis direction. Thus, the direction of magnetic fields generated at resonators RC1 and RC2 and the direction of magnetic fields generated at resonators RC3 to RC5 will be in a skewed position. This prevents or reduces magnetic coupling at least between resonator RC1 and resonator RC3 and between resonator RC2 and resonator RC4, resulting in reducing propagation of a signal in a non-passband accompanying magnetic coupling. Therefore, filter device 100 according to the first example embodiment can provide a better attenuation characteristic in a non-passband than such a configuration as filter device 200 according to the comparative example.

"Plate electrode PG1" and "plate electrode PG2" in the first example embodiment correspond to a "first electrode" and a "second electrode," respectively, in the present disclosure. "Resonators RC1 to RC5" in the first example embodiment correspond to a "first resonator" to a "fifth resonator," respectively, in the present disclosure. "Plate conductor PL1" and "plate conductor PL2" in the first example embodiment correspond to a "first plate conductor" and a "second plate conductor," respectively, in the present disclosure. "Capacitor electrode PC3" to "capacitor electrode PC5" in the first example embodiment correspond to a "first capacitor electrode" to a "third capacitor electrode," respectively, in the present disclosure. "Inductor via V30," "inductor via V40," and "inductor vias V51 and V52" in the first example embodiment correspond to a "first inductor via" to a "third inductor via," respectively, in the present disclosure. The "X-axis direction," the "Y-axis direction," and the "Z-axis direction" in the first example embodiment correspond to a "first direction," a "second direction," and a "third direction," respectively, in the present disclosure.

First Modification

For filter device 100 according to the first example embodiment, an example in which resonators RC1 and RC2 connected to the input/output terminals are configured by distributed constant resonators and resonators RC3 to RC5 disposed between resonator RC1 and resonator RC2 are all configured by λ/4 resonators, has been described. However, even a different configuration can also achieve a similar effect insofar as distributed constant resonators and λ/4 resonators coexist along a propagation path for a signal from the input terminal to the output terminal.

Figure 6:
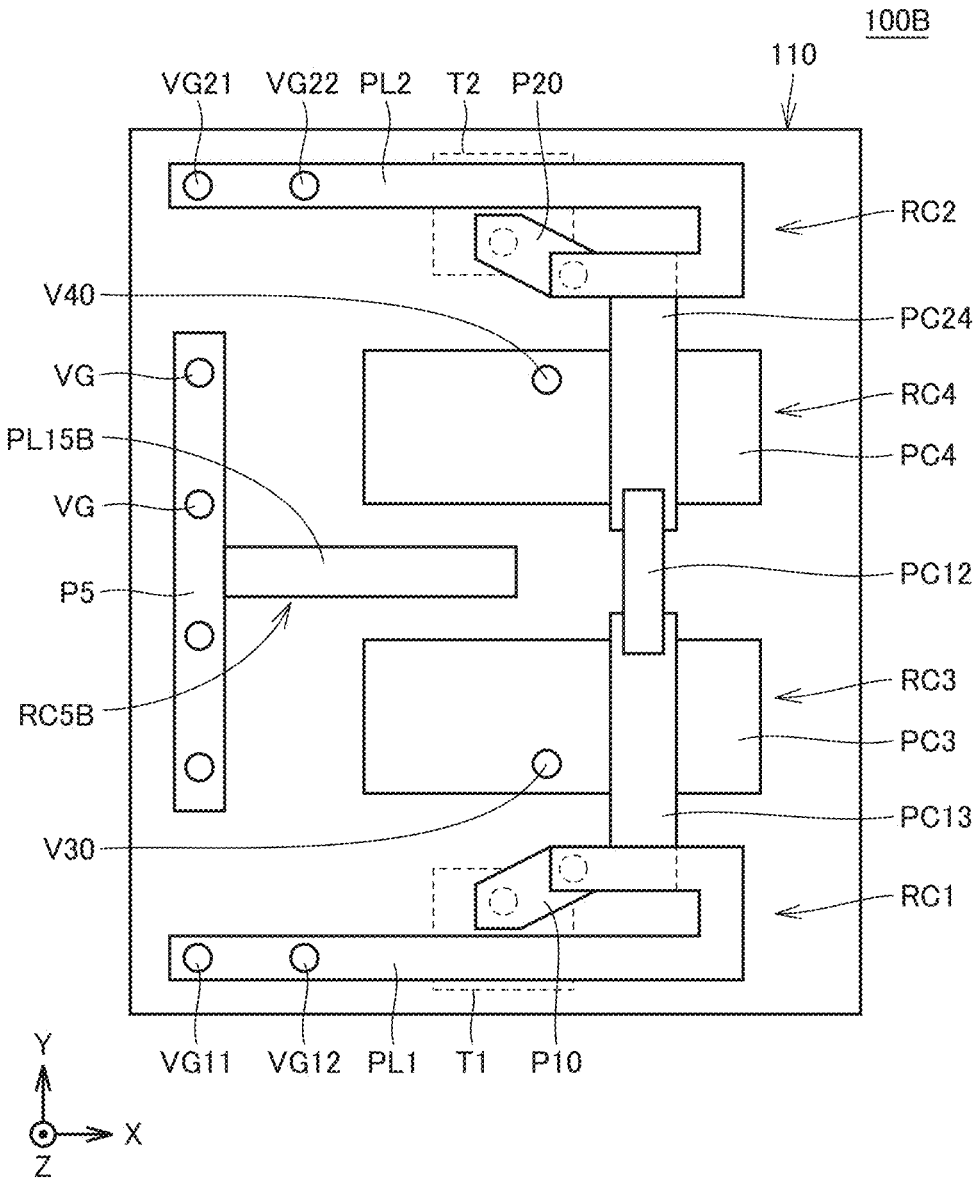
FIG. 6 is a plan view showing an interior of a filter device according to a first modification of an example embodiment of the present invention.

FIG. 6 is a plan view showing an interior of a filter device 100B according to a first modification of an example embodiment of the present invention. Filter device 100B has a configuration in which resonator RC5 in filter device 100 of the first example embodiment is replaced with a resonator RC5B. Any component of filter device 100B shown in FIG. 6 that is identical to filter device 100 will not be described repeatedly.

Referring to FIG. 6, resonator RC5B, as well as each resonator in the comparative example of FIG. 4, is configured as a distributed constant resonator having one end connected to a ground terminal and the other end open. Specifically, resonator RC5B includes a strip-shaped plate conductor PL15B extending in the X-axis direction. An end of plate conductor PL15B in the negative direction along the X axis is connected to a plate electrode P5 extending in the Y axis direction. Plate electrode P5 is connected to plate electrodes PG1 and PG2 by a plurality of ground vias VG. An end of plate conductor PL15B in the positive direction along the X axis is open.

Plate conductor PL15B extends between resonator RC3 and resonator RC4, and resonator RC5B is coupled to resonator RC3 and resonator RC4 by an electromagnetic field. A radio-frequency signal received at input terminal T1 propagates through resonators RC1, RC3, RC5B, RC4 and RC2 sequentially in this order, and is output at output terminal T2.

Figure 7:
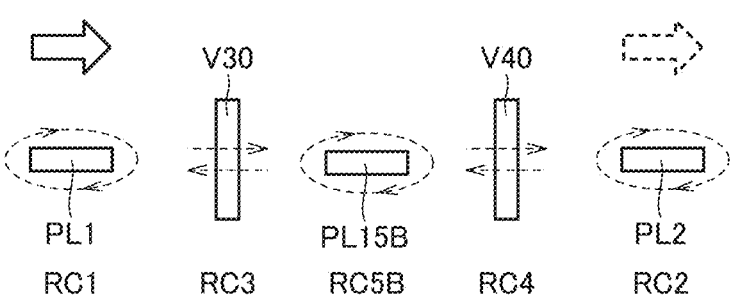
FIG. 7 is a diagram for illustrating directions of magnetic fields of resonators in the filter device according to the first modification.

FIG. 7 is a diagram for illustrating directions of magnetic fields of resonators in filter device 100B according to the first modification. As shown in FIG. 7, filter device 100B has a configuration in which distributed constant resonators RC1, RC5B and RC2 and λ/4 resonators RC3 and RC4 are alternately disposed along a signal path from input terminal T1 to output terminal T2. Therefore, magnetic coupling between resonator RC3 and resonators RC1 and RC5B and magnetic coupling between resonator RC4 and resonators RC2 and RC5B are prevented or reduced. This can improve an attenuation characteristic in a non-passband.

"Plate conductor PL15B" in the first modification corresponds to a "third plate conductor" in the present disclosure.

Second Modification

In a second modification of an example embodiment of the present invention, an example of a different arrangement of a distributed constant resonator such as resonator RC5B in the first modification will be described.

Figure 8:
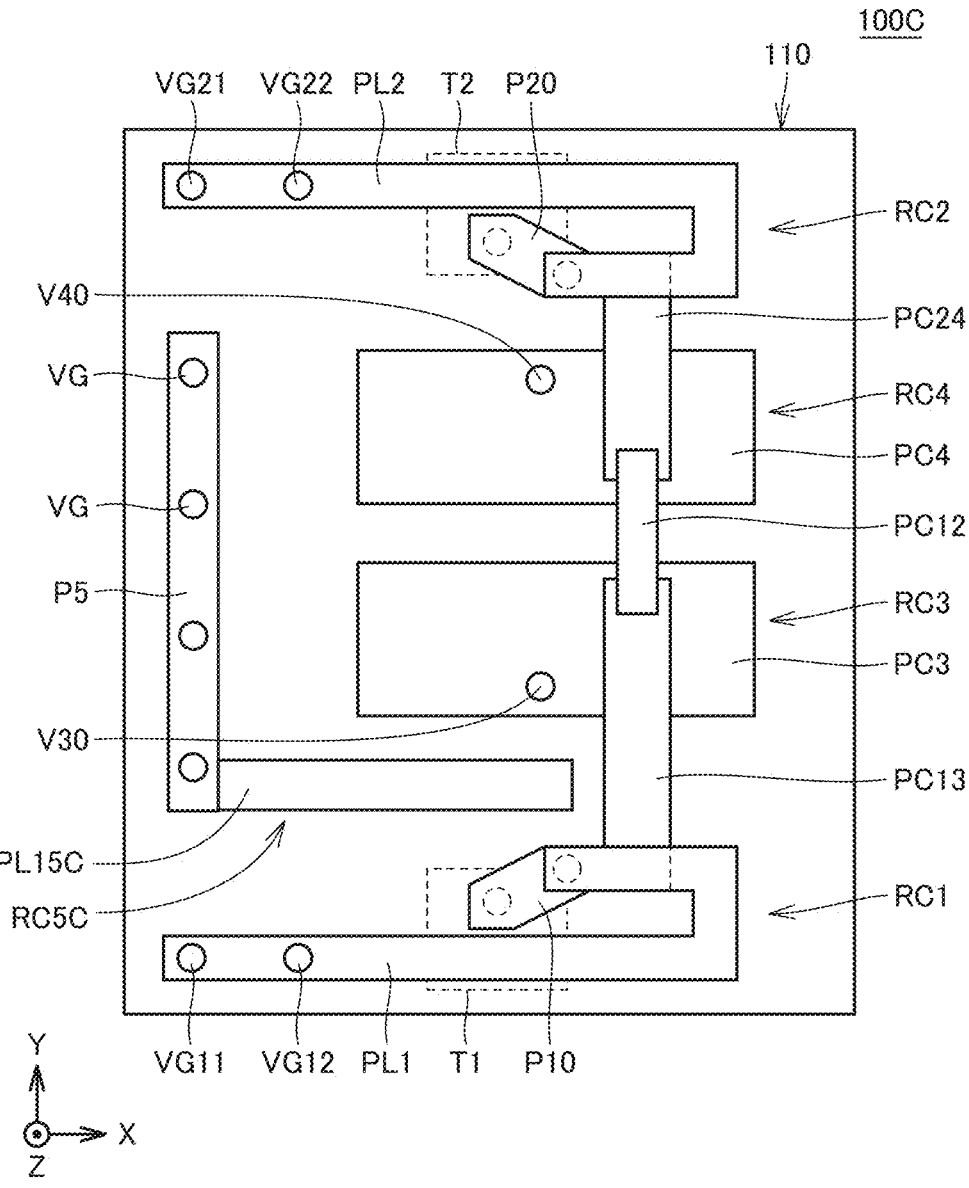
FIG. 8 is a plan view showing an interior of a filter device according to a second modification of an example embodiment of the present invention.

FIG. 8 is a plan view showing an interior of a filter device 100C according to the second modification. Filter device 100C has a configuration in which resonator RC5B in filter device 100B of the first modification is replaced with a resonator RC5C. Any component of filter device 100C shown in FIG. 8 that is identical to filter device 100B will not be described repeatedly.

Referring to FIG. 8, filter device 100C includes resonator RC5C including a strip-shaped plate conductor PL15C extending in the X-axis direction. An end of plate conductor PL15C in the negative direction along the X axis is connected to plate electrode P5. An end of plate conductor PL15C in the positive direction along the X axis is open. Plate conductor PL15C extends between resonator RC1 and resonator RC3, and resonator RC5C is coupled to resonator RC1 and resonator RC3 by an electromagnetic field. A radio-frequency signal received at input terminal T1 propagates through resonators RC1, RC5C, RC3, RC4 and RC2 sequentially in this order, and is output at output terminal T2.

Figure 9:
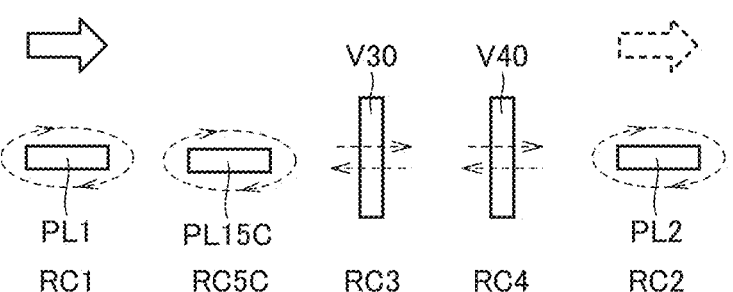
FIG. 9 is a diagram for illustrating directions of magnetic fields of resonators in the filter device according to the second modification.

FIG. 9 is a diagram for illustrating directions of magnetic fields of resonators in filter device 100C according to the second modification. As illustrated in FIG. 9, in filter device 100C, resonator RC5C and resonator RC3 generate magnetic fields in a skewed position and so do resonator RC4 and resonator RC2. Thus, magnetic coupling between the resonators can thus be prevented reduced. This can improve an attenuation characteristic in a non-passband.

"Plate conductor PL15C" in the second modification corresponds to a "fourth plate conductor" in the present disclosure.

Third Modification

In a third modification of an example embodiment of the present invention, another example of a different arrangement of a distributed constant resonator such as resonator RC5B in the first modification will be described.

Figure 10:
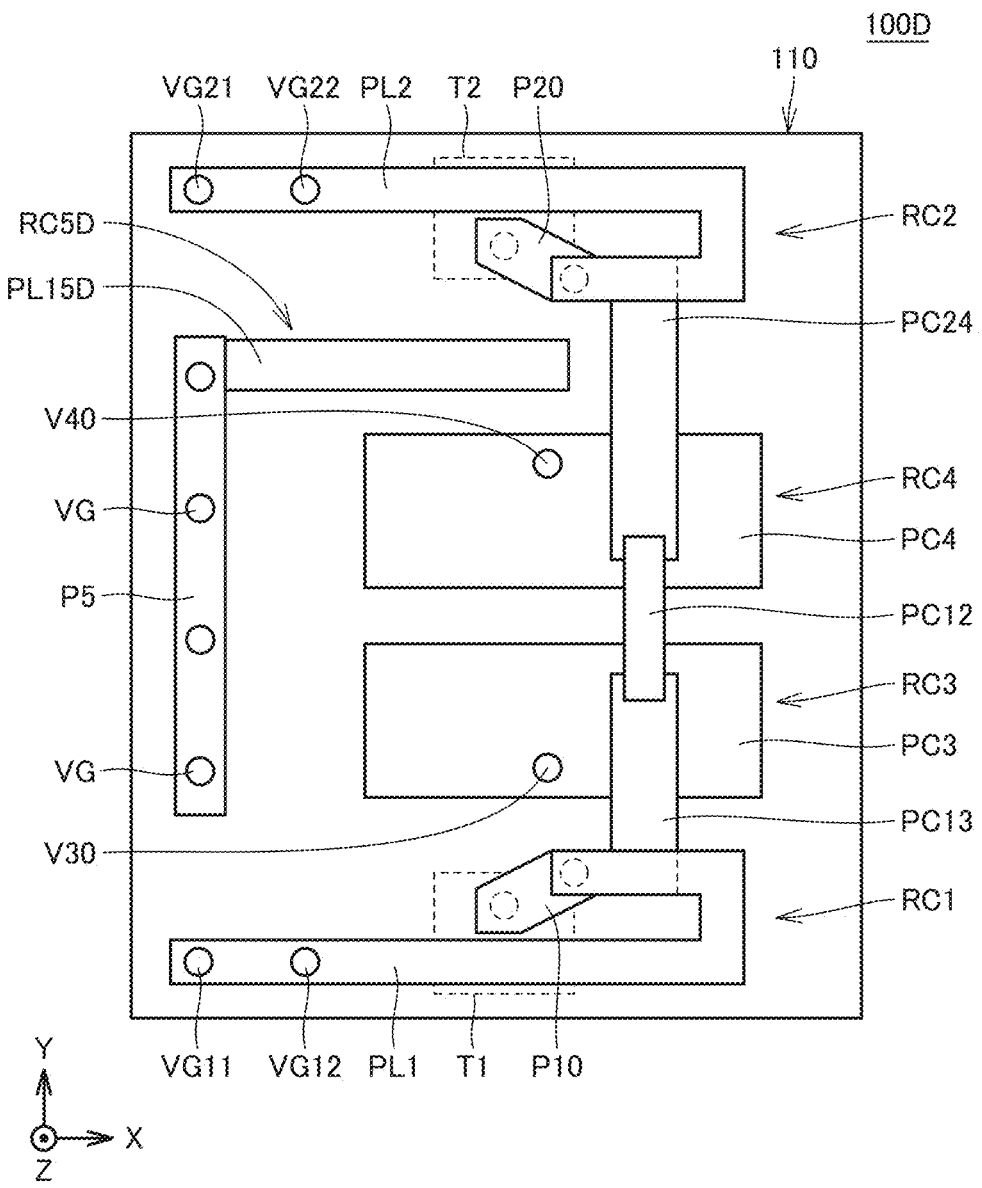
FIG. 10 is a plan view showing an interior of a filter device according to a third modification of an example embodiment of the present invention.

FIG. 10 is a plan view for illustrating an interior of a filter device 100D according to the third modification. Filter device 100D has a configuration in which resonator RC5B in filter device 100B of the first modification is replaced with a resonator RC5D. Any component of filter device 100D shown in FIG. 10 that is identical to filter device 100B will not be described repeatedly.

Referring to FIG. 10, filter device 100D includes resonator RC5D including a strip-shaped plate conductor PL15D extending in the X-axis direction. An end of plate conductor PL15D in the negative direction along the X axis is connected to plate electrode P5. An end of plate conductor PL15D in the positive direction along the X axis is open. Plate conductor PL15D extends between resonator RC2 and resonator RC4, and resonator RC5D is coupled to resonator RC2 and resonator RC4 by an electromagnetic field. A radio-frequency signal received at input terminal T1 propagates resonators RC1, RC3, RC4, RC5D and RC2 sequentially in this order, and is output at output terminal T2.

Figure 11:
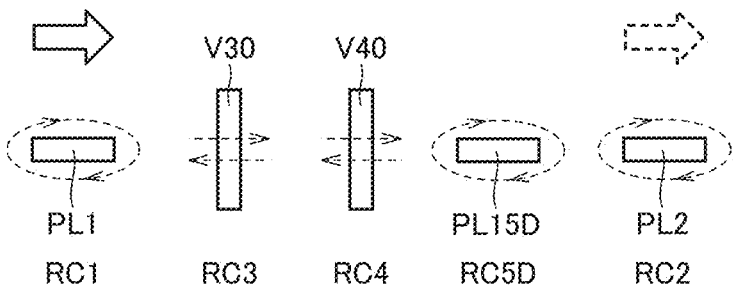
FIG. 11 is a diagram for illustrating directions of magnetic fields of resonators in the filter device according to the third modification.

FIG. 11 is a diagram for illustrating directions of magnetic fields of resonators in filter device 100D according to the third modification. As illustrated in FIG. 11, in filter device 100D, resonator RC1 and resonator RC3 generate magnetic fields in a skewed position and so do resonator RC4 and resonator RC5D. Thus, magnetic coupling between the resonators can thus be prevented or reduced. This can improve an attenuation characteristic in a non-passband.

"Plate conductor PL15D" in the third modification corresponds to a "fourth plate conductor" in the present disclosure.

While for the first to third modifications described above, a case in which only one of the three resonators disposed between resonator RC1 and resonator RC2 is a distributed constant resonator has been described, a configuration may be adopted in which only one of the three resonators is a λ/4 resonator and the other two resonators are distributed constant resonators.

Second Example Embodiment

While the filter devices of the first example embodiment and the first to third modifications include five resonators, the number of resonators is not necessarily limited to five. In a second example embodiment, an example in which a filter device includes four resonators will be described.

Figure 12:
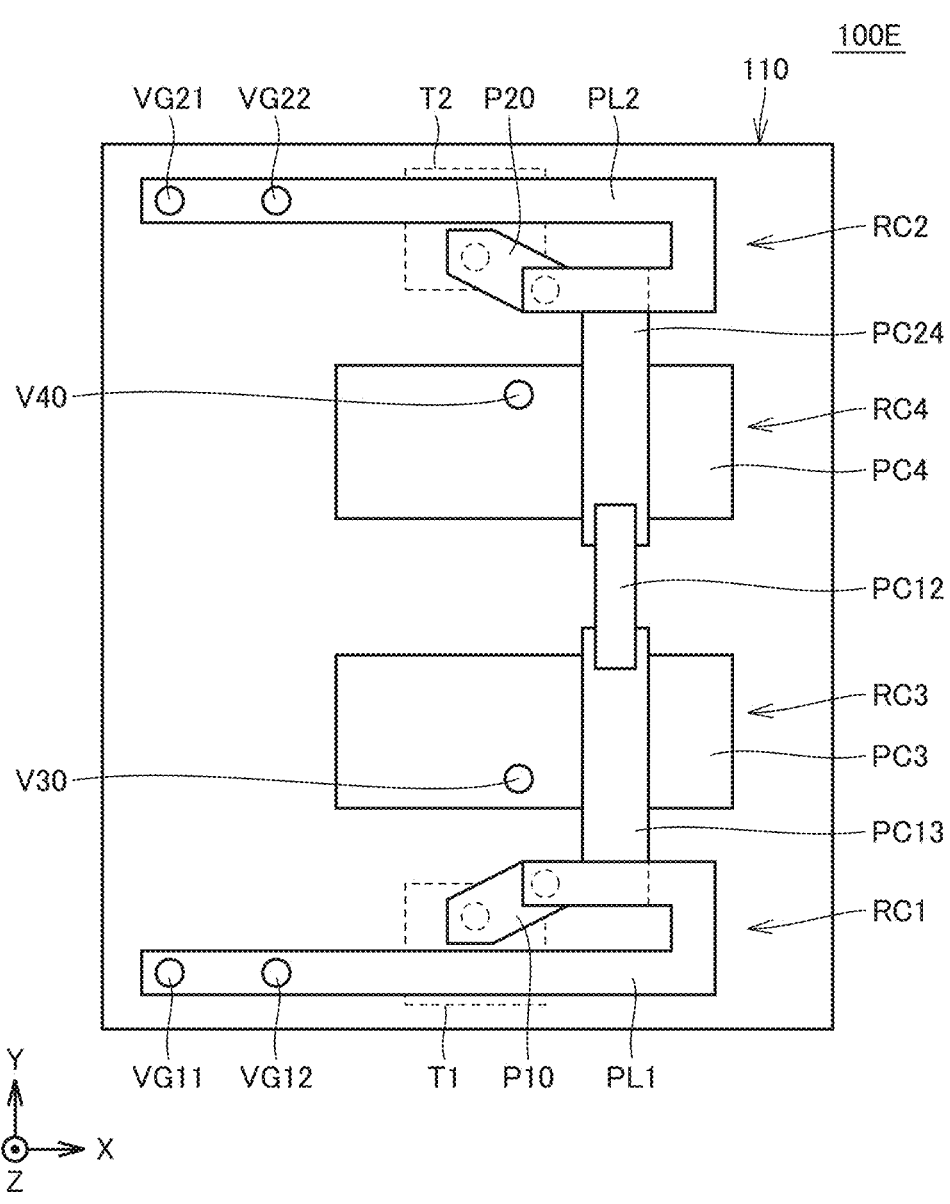
FIG. 12 is a plan view showing an interior of a filter device according to a second example embodiment of the present invention.

FIG. 12 is a plan view showing an interior of a filter device 100E according to the second example embodiment. Filter device 100E corresponds to filter device 100 of the first example embodiment minus resonator RC5. That is, filter device 100E receives a radio-frequency signal received at input terminal T1 propagates through resonators RC1, RC3, RC4 and RC2 sequentially in this order, and is output at output terminal T2.

Filter device 100E is also configured to have resonators RC3 and RC4 that are λ/4 resonators disposed between resonators RC1 and RC2 that are distributed constant reso-nators. Therefore, in filter device 100E, resonator RC1 and resonator RC3 generate magnetic fields in a skewed position and so do resonator RC2 and resonator RC4. Thus, filter device 100E can also improve an attenuation characteristic in a non-passband.

Note that increasing the number of stages of resonators allows more attenuation poles to be provided, and adjusting an attenuation pole in frequency can increase an amount of attenuation in a non-passband and improve attenuation in steepness. On the other hand, as the number of resonators through which a signal passes increases, a loss in a passband increases. That is, as the number of resonators increases, an attenuation characteristic in a non-passband and a loss characteristic in a passband will have a trade-off relation-ship. Therefore, the number of resonators of a filter device is determined, as appropriate, depending on the required attenuation characteristic and insertion loss.

Third Example Embodiment

In a third example embodiment, an example in which a filter device includes three resonators will be described.

Figure 13:
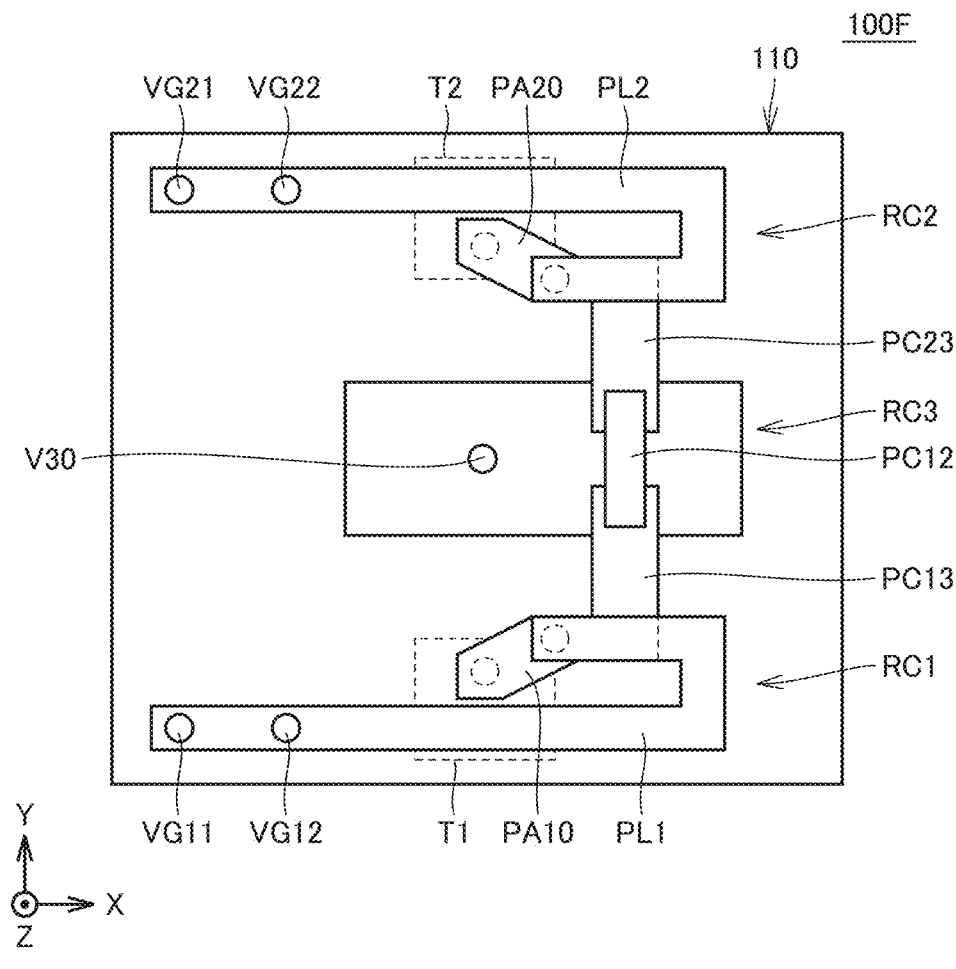
FIG. 13 is a plan view showing an interior of a filter device according to a third example embodiment of the present invention.

FIG. 13 is a plan view showing an interior of a filter device 100F according to the third example embodiment. Filter device 100F has a configuration in which resonator RC4 is further removed from the configuration of filter device 100E of the second example embodiment. That is, in filter device 100F, a radio-frequency signal received at input terminal Tl is propagated through resonators RC1, RC3 and RC2 sequentially in this order, and output at output terminal T2.

As resonator RC4 is removed, plate electrode PC24 to adjust a degree of coupling between resonator RC2 and resonator RC4 is also removed, and instead, a plate electrode PC23 is added to adjust a degree of coupling between resonator RC2 and resonator RC3. In this case, plate elec-trode PC12 to adjust a degree of coupling between resonator RC1 and resonator RC2 is disposed so as to overlap with plate electrode PC13 and plate electrode PC23.

Filter device 100F is also configured to have resonator RC3 that is a λ/4 resonator disposed between resonators RC1 and RC2 that are distributed constant resonators. Therefore, in filter device 100E, resonator RC1 and resona-tor RC3 generate magnetic fields in directions in a skewed position and so do resonator RC2 and resonator RC3. Filter device 100F can thus also improve an attenuation charac-teristic in a non-passband.

While example embodiments of the present invention have been described above, it is to be understood that variations and modifications will be apparent to those skilled in the art without departing from the scope and spirit of the present invention. The scope of the present invention, there-fore, is to be determined solely by the following claims.

What is claimed is:

1. A filter device comprising:
a dielectric;
an input terminal;
an output terminal;
a ground terminal provided in the dielectric;
a first electrode and a second electrode located in the dielectric opposite to each other and connected to the ground terminal;
a first resonator connected to the input terminal;
a second resonator connected to the output terminal; and
a third resonator between the first resonator and the second resonator in the dielectric;

the first resonator including a first plate conductor with a first end connected to the input terminal and a second end connected to the ground terminal;
the second resonator including a second plate conductor with a first end connected to the output terminal and a second end connected to the ground terminal;
the first and second plate conductors each extending in a first direction in the dielectric;
the first, second and third resonators being arranged in a second direction intersecting the first direction; and
the third resonator including:
a first capacitor electrode opposite to the second elec-trode; and
a first inductor via directly connected to the first capacitor electrode and the first electrode, and extending in a third direction directed from the first electrode toward the second electrode.

2. The filter device according to claim 1, wherein the first and second plate conductors each include a bent portion directed from the first direction toward the second direction.

3. The filter device according to claim 1, wherein the first and second plate conductors are located in a same plane in the dielectric.

4. The filter device according to claim 1, wherein the first and second plate conductors are located in the dielectric in a first plane and the first capacitor electrode is located in the dielectric in a second plane different from the first plane.

5. The filter device according to claim 1, further com-prising a fourth resonator between the second resonator and the third resonator in the dielectric; wherein
the fourth resonator includes:
a second capacitor electrode opposite to the second electrode; and
a second inductor via connected to the second capacitor electrode and the first electrode, and extending in the third direction.

6. The filter device according to claim 5, wherein each of the first and second capacitor electrodes has a rectangular or substantially rectangular shape extending in the first direc-tion.

7. The filter device according to claim 5, further com-prising a fifth resonator provided in the dielectric, and magnetically coupled to the third resonator and the fourth resonator.

8. The filter device according to claim 7, wherein the fifth resonator includes:
a third capacitor electrode opposite to the second elec-trode; and
a third inductor via connected to the third capacitor electrode and the first electrode, and extending in the third direction.

9. The filter device according to claim 8, wherein the third capacitor electrode has a rectangular or substantially rect-angular shape extending in the second direction, and is located at a position separated from the first and second capacitor electrodes in the first direction.

10. The filter device according to claim 7, wherein
the fifth resonator includes a third plate conductor between the third resonator and the fourth resonator in the dielectric, and extending in the first direction; and
the third plate conductor includes a first end connected to the ground terminal and a second end that is open.

11. The filter device according to claim 7, wherein
the fifth resonator includes a fourth plate conductor in the dielectric between the first resonator and the third resonator or between the second resonator and the fourth resonator and extending in the first direction; and the fourth plate conductor includes a first end connected to the ground terminal and a second end that is open.

12. The filter device according to claim 7, wherein the first and second resonators include parasitic capacitance and no capacitor electrode.

13. The filter device according to claim 7, wherein magnetic coupling among at least two of the first, second, third, fourth or fifth resonators has a skewed position.

14. The filter device according to claim 1, wherein at least one of the first, second, or third resonators is a distributed constant resonator.

15. The filter device according to claim 1, wherein at least one of the first, second, or third resonators is a λ/4 resonator.

16. The filter device according to claim 1, wherein the filter device is a bandpass filter.

17. A radio-frequency front end circuit comprising the filter device according to claim 1.

18. A communication apparatus comprising the radio-frequency front end circuit according to claim 17.

19. A filter device comprising:

a dielectric;

an input terminal;

an output terminal;

a ground terminal provided in the dielectric;

a first electrode and a second electrode located in the dielectric opposite to each other and connected to the ground terminal;

a first resonator connected to the input terminal;

a second resonator connected to the output terminal; and a third resonator between the first resonator and the second resonator in the dielectric;

the first resonator including a first plate conductor with a first end connected to the input terminal and a second end connected to the ground terminal;

the second resonator including a second plate conductor with a first end connected to the output terminal and a second end connected to the ground terminal;

the first and second plate conductors each extending in a first direction in the dielectric;

the first, second and third resonators being arranged in a second direction intersecting the first direction; and the third resonator including:

a first capacitor electrode opposite to the second electrode; and a first inductor via connected to the first capacitor electrode and the first electrode, and extending in a third direction directed from the first electrode toward the second electrode, the first inductor via being a single via including a first end connected to the first capacitor electrode and a second end connected to the first electrode.

20. A filter device comprising:

a dielectric;

an input terminal;

an output terminal;

a ground terminal provided in the dielectric;

a first electrode and a second electrode located in the dielectric opposite to each other and connected to the ground terminal;

a first resonator connected to the input terminal;

a second resonator connected to the output terminal; and a third resonator between the first resonator and the second resonator in the dielectric;

the first resonator including a first plate conductor with a first end connected to the input terminal and a second end connected to the ground terminal;

the second resonator including a second plate conductor with a first end connected to the output terminal and a second end connected to the ground terminal;

the first and second plate conductors each extending in a first direction in the dielectric;

the first, second and third resonators being arranged in a second direction intersecting the first direction; and the third resonator including:

a first capacitor electrode opposite to the second electrode, the first capacitor electrode defining a capacitor with the second electrode; and a first inductor via connected to the first capacitor electrode and the first electrode, and extending in a third direction directed from the first electrode toward the second electrode.

* * * * *